(12) United States Patent
Bang et al.

(10) Patent No.: US 11,646,248 B2
(45) Date of Patent: May 9, 2023

(54) SEMICONDUCTOR DEVICE HAVING A LEAD FLANK AND METHOD OF MANUFACTURING A SEMICONDUCTOR DEVICE HAVING A LEAD FLANK

(71) Applicant: Amkor Technology Singapore Holding Pte. Ltd., Singapore (SG)

(72) Inventors: Won Bae Bang, Incheon (KR); Kwang Seok Oh, Incheon (KR); George Scott, Chandler, AZ (US)

(73) Assignee: Amkor Technology Singapore Holding Pte. Ltd., Singapore (SG)

(\*) Notice: Subject to any disclaimer, the term of this patent is extended or adjusted under 35 U.S.C. 154(b) by 0 days.

(21) Appl. No.: 17/700,962

(22) Filed: Mar. 22, 2022

(65) Prior Publication Data

US 2022/0216132 A1 Jul. 7, 2022

Related U.S. Application Data

(62) Division of application No. 16/437,106, filed on Jun. 11, 2019, now abandoned.

(51) Int. Cl.
| | |
|---|---|
| *H01L 23/495* | (2006.01) |
| *H01L 21/48* | (2006.01) |
| *H01L 21/56* | (2006.01) |
| *H01L 23/48* | (2006.01) |
| *H01L 23/31* | (2006.01) |
| *H01L 23/00* | (2006.01) |
| *H01L 23/498* | (2006.01) |

(52) U.S. Cl.
CPC ........ *H01L 23/481* (2013.01); *H01L 21/4846* (2013.01); *H01L 21/561* (2013.01); *H01L 21/565* (2013.01); *H01L 23/315* (2013.01); *H01L 23/49513* (2013.01); *H01L 23/49548* (2013.01); *H01L 23/49582* (2013.01); *H01L 23/49861* (2013.01); *H01L 24/96* (2013.01)

(58) Field of Classification Search
CPC .............. H01L 21/4846; H01L 23/495–49894
See application file for complete search history.

(56) References Cited

U.S. PATENT DOCUMENTS

| | | | |
|---|---|---|---|
| 9,048,228 B2 | 6/2015 | Do et al. | |
| 9,741,642 B1 | 8/2017 | Nondhasitthichai et al. | |
| 10,199,312 B1 | 2/2019 | Rivera-Marty | |
| 10,529,655 B2 | 1/2020 | Rivera-Marty | |
| 2002/0192857 A1 | 12/2002 | Igarashi et al. | |

(Continued)

*Primary Examiner* — Robert G Bachner
*Assistant Examiner* — Molly K Reida
(74) *Attorney, Agent, or Firm* — Spectrum IP Law Group LLC

(57) ABSTRACT

A semiconductor device comprises a substrate having a substrate top side, a substrate lateral side, and a substrate bottom side, an electronic device on the substrate top side, and an encapsulant on the substrate top side and contacting a lateral surface of the electronic device. The substrate comprises a conductive structure and a dielectric structure that extends comprising a protrusion in contact with the encapsulant. The conductive structure comprises a lead comprising a lead flank, the lead flank comprising a cavity and a conductive coating on a surface of the lead in the cavity. The conductive structure comprises a pad exposed at the substrate top side, embedded in the dielectric structure, and adjacent to the protrusion, to electrically couple with the electronic device via a first internal interconnect. Other examples and related methods are also disclosed herein.

20 Claims, 11 Drawing Sheets

(56) References Cited

U.S. PATENT DOCUMENTS

| | | |
|---|---|---|
| 2011/0244629 A1 | 10/2011 | Gong et al. |
| 2014/0151865 A1 | 6/2014 | Koschmieder |
| 2016/0157345 A1 | 6/2016 | Kobayashi |
| 2016/0254214 A1 | 9/2016 | Makino |
| 2017/0256509 A1 | 9/2017 | Lee et al. |
| 2019/0148270 A1 | 5/2019 | Rivera-Marty |
| 2019/0206768 A1 | 7/2019 | Shibuya et al. |
| 2020/0144164 A1 | 5/2020 | Rivera-Marty |
| 2021/0050284 A1 | 2/2021 | Rivera-Marty |

SEMICONDUCTOR DEVICE HAVING A LEAD FLANK AND METHOD OF MANUFACTURING A SEMICONDUCTOR DEVICE HAVING A LEAD FLANK

CROSS-REFERENCE TO RELATED APPLICATIONS

The present application is a divisional of U.S. application Ser. No. 16/437,106 filed Jun. 11, 2019 (pending). Said application Ser. No. 16/437,106 and Publication No. US 2020/0395272 A1 are hereby incorporated herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor devices and methods for forming semiconductor devices are inadequate, for example resulting in excess cost, decreased reliability, relatively low performance, or device sizes that are too large. Further limitations and disadvantages of conventional and traditional approaches will become apparent to one of skill in the art, through comparison of such approaches with the present disclosure and reference to the drawings.

Figure 1A:
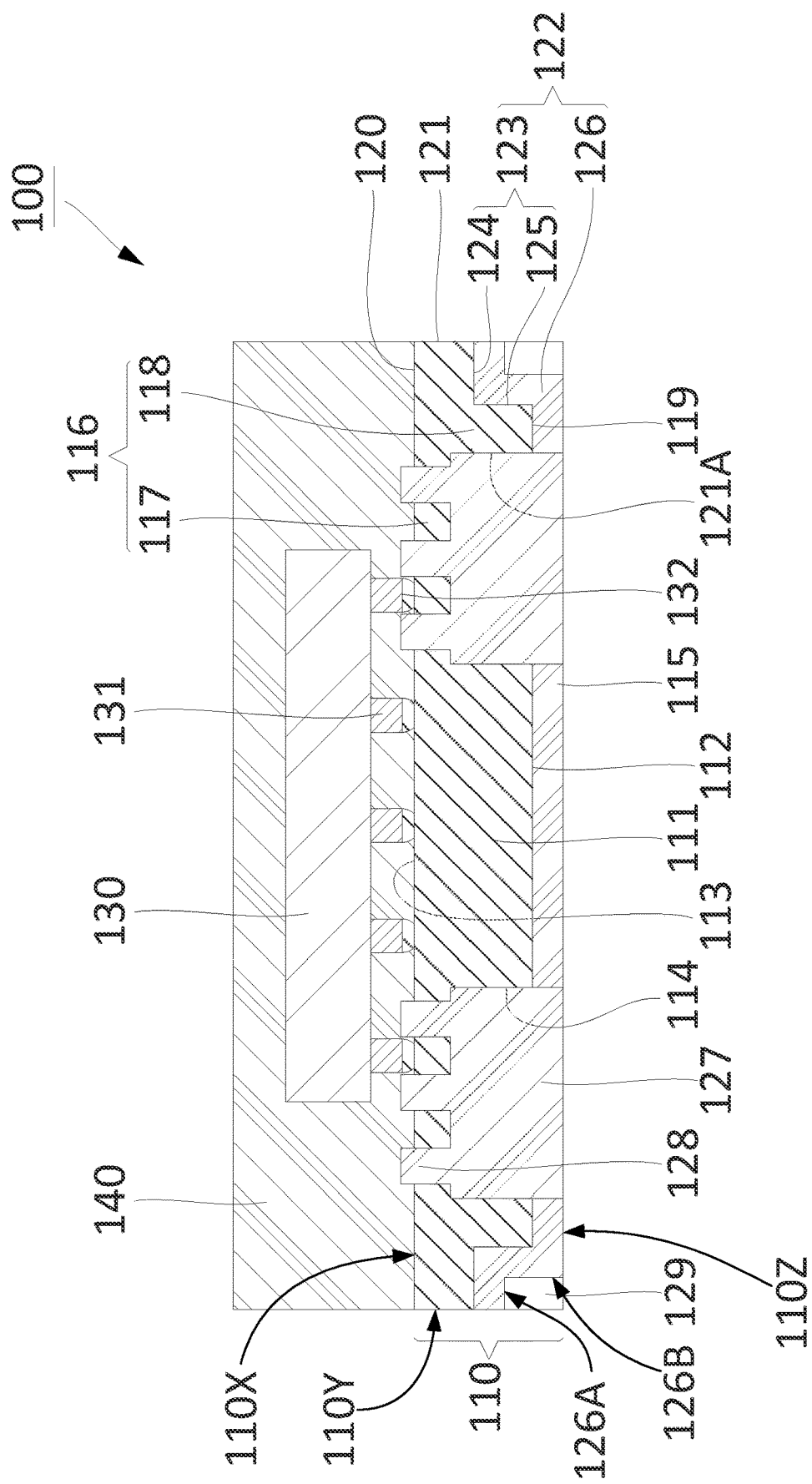
FIGS. 1A and 1B show a cross-sectional view and a bottom view of an example semiconductor device and FIG. 1C shows an enlarged view of a region 1C of FIG. 1B.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques can be omitted to avoid unnecessarily obscuring the present disclosure. In addition, elements in the drawing figures are not necessarily drawn to scale. For example, the dimensions of some of the elements in the figures can be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features.

The terms "first," "second," etc. can be used to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" can be used to describe two elements directly contacting each other or describe two elements indirectly connected by one or more other elements. For example, if element A can be coupled to element B, then element A can be directly contacting element B or indirectly connected to element B by an intervening element C. Similarly, the terms "over" or "on" can be used to describe two elements directly contacting each other or describe two elements indirectly connected by one or more other elements. Geometrical descriptive terms, such as coplanar, planar, perpendicular, vertical, horizontal, among others, encompass not only such exact terms, but also substantial approximations of such terms, for example, within manufacturing tolerances.

DESCRIPTION

A semiconductor device comprises a substrate having a substrate top side, a substrate lateral side, and a substrate bottom side, an electronic device on the substrate top side, and an encapsulant on the substrate top side and contacting a lateral surface of the electronic device. The substrate comprises a conductive structure and a dielectric structure comprising a protrusion in contact with the encapsulant. The conductive structure comprises a lead comprising a lead flank, the lead flank comprising a cavity and a conductive coating on a surface of the lead flank in the cavity. The conductive structure comprises a pad exposed at the substrate top side, embedded in the dielectric structure, and adjacent to the protrusion, to electrically couple with the electronic device via a first internal interconnect.

A method to manufacture a semiconductor device comprises forming a conductive layer on a carrier, forming a pad and a lead on a top surface of the conductive layer, forming a dielectric structure on the top surface of the conductive layer, wherein the dielectric structure covers the pad and the lead, thinning the dielectric structure until the lead is exposed, etching the lead so that a surface of the lead is depressed relative to a surface of the dielectric structure, forming a cavity in the lead adjacent to the dielectric structure, forming a plating layer on the lead, including on a surface of the cavity, to form a wettable flank corresponding to the plated cavity; and removing the carrier and etching the conductive layer so that a protrusion of the dielectric structure protrudes beyond the bottom surface of the pad.

A method to manufacture a semiconductor device comprises providing a dielectric structure in a conductive structure, wherein the dielectric structure comprises a protrusion and the conductive structure comprises a pad bounded by the protrusion, forming a cavity in the lead adjacent to the dielectric structure, and providing a plating on the conductive structure to cover the lead, including covering a surface of the cavity, wherein the plated cavity forms a wettable flank.

Other examples are included in the present disclosure. Such examples can be found in the figures, in the claims, or in the description of the present disclosure.

Figure 1B:
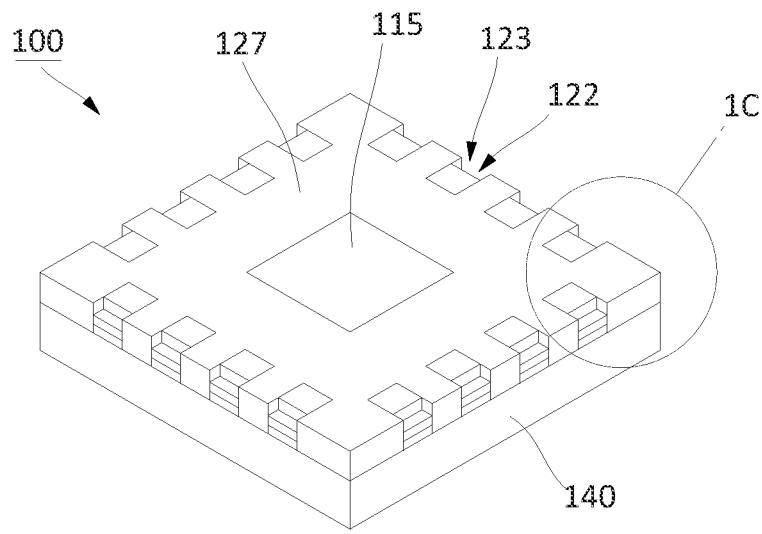
Figure 1C:
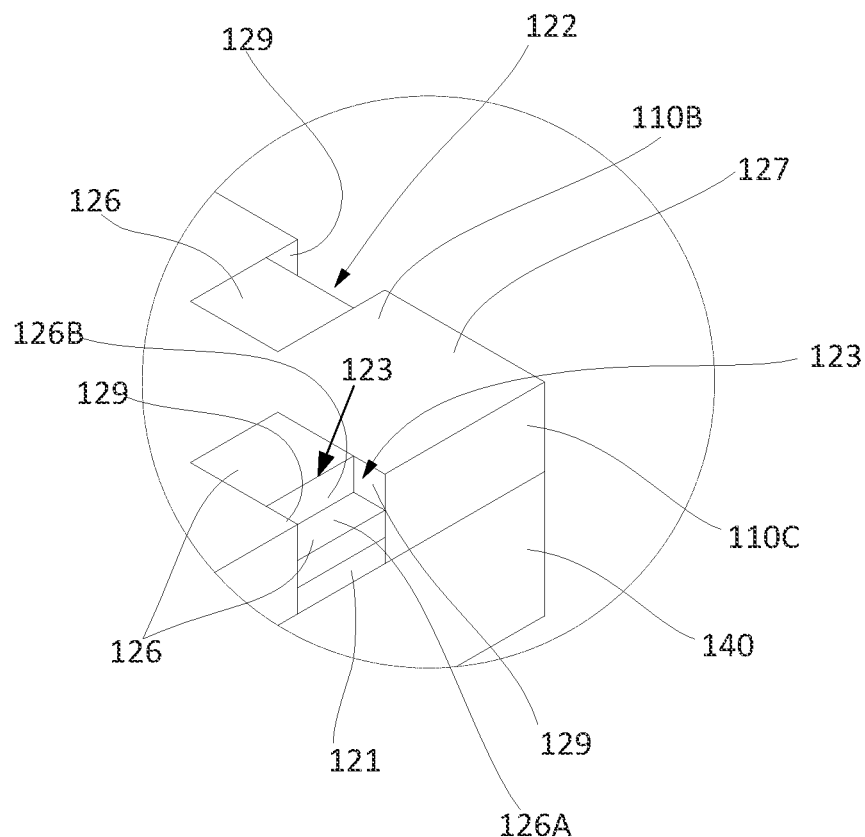

FIG. 1A and FIG. 1B show a cross-sectional view and a bottom view of an example semiconductor device 100 and FIG. 1C shows an enlarged view of a region 1C of FIG. 1B. In the example shown in FIGS. 1A-1C, semiconductor device 100 can comprise a substrate 110, an electronic device 130 mounted on substrate 110, and an encapsulant (or molding compound) 140 covering substrate 110 and electronic device 130. In some examples, substrate 110 can be referred to as a pre-molded substrate, and can comprise substrate top side 110X, substrate lateral sides 110Y, and substrate bottom side 110Z. In some examples, electronic device 130 can be on the substrate top side 110X, and encapsulant 140 can be on the substrate top side 110X and contacting a lateral surface of electronic device 130. Substrate 110 can comprise a conductive structure 116 and a dielectric structure 127 mechanically (i.e., non-electrically) connecting different elements of conductive structure 116. In some examples, the dielectric structure 127 can comprise a protrusion in comprise a protrusion 128 in contact with encapsulant 140.

In some examples, conductive structure 116 can comprise paddle 111 or die pad. In addition, conductive structure 116 can comprise pad 117 and lead 118. Paddle 111 can be exposed at the substrate top side 110X, embedded in dielectric structure 127. Conductive structure 116 can comprise a pad 117 exposed at a substrate top side 110X adjacent to protrusion 128. Pad 117 can electrically couple with electronic device 130 via an internal interconnect 132. Paddle 111 can comprise a planar surface 112, a planar surface 113 opposite to surface 112, mechanically connected to encapsulant 140 and electrically connected to electronic device 130, and a surface 114 connecting surface 112 to surface 113 and mechanically connected to dielectric structure 127. In addition, paddle 111 can further comprise external conductive coating or layer 115 formed on surface 112. External coating 115 can comprise or be referred to as a wettable coating or plating, and can allow paddle 111 to be wettable for electrical connection to an external device by, for example, a solder material.

Paddle 111 can be made of, but not limited to, copper, copper/iron alloy, stainless steel, or copper/stainless steel/copper clad metal. For example, coating 115 can be made of, but not limited to, gold, silver, nickel, palladium, tin or alloys.

In some examples, conductive structure 116 can comprise or be referred to as leads, pads, traces, wiring patterns, circuit patterns, or paths. Conductive structure 116 can be arranged around paddle 111. In some examples, the planar shape of paddle 111 can be rectangular, and conductive structure 116 can be arranged in four directions. Conductive structure 116 can comprise a relatively thin pad 117 and a lead 118 electrically connected to pad 117, and can be relatively thick compared to pad 117. In some examples, pad 117 can be a section of a trace to which an interconnect, such as internal interconnect 131, couples to. In some examples pad 117 can comprise a width similar to the width of adjacent portions of the trace, but there can be other examples where pad 117 can be wider than such adjacent portions of the trace.

Pad 117 can be electrically connected to electronic device 130, and lead 118 can be electrically connected to an external device through a solder or the like. Pad 117 can be positioned roughly on the dielectric structure 127 and be mechanically connected to dielectric structure 127 and encapsulant 140. Lead 118 can be also mechanically connected to dielectric structure 127 and encapsulant 140.

In some examples, conductive structure 116 can comprise a lead 118 comprising lead flank (or wettable flank) 122. In some examples, lead flank 122 can be referred as a wettable flank, an inspectable joint, or a solderable lead end. Lead flank 122 can comprise cavity 123 having a predetermined depth, and external conductive coating or layer 126 comprising one or more conductive layers formed on cavity 123. In some examples, lead flank 122 can comprise a conductive coating 126 on a surface of lead flank 122 in cavity 123. Such an external conductive coating 126 can comprise or be referred to as a wettable coating or plating, or can be similar to or formed during a same process as external coating 115. In some examples, cavity 123 can be provided in lead 118 adjacent to dielectric structure 127, and the wettable coating or plating can be provided on conductive structure 127 to cover lead 118 including covering a surface of lead 118 in cavity 123 wherein the plated lead 118 in the cavity forms a wettable flank.

In some examples, lead 118 can comprise surface 119 facing a bottom of semiconductor device 100, surface 120 opposite to surface 119 and connected to encapsulant 140, and surfaces 121 and 121A connecting surface 119 and surface 120 to each other. Here, surface 121A can be mechanically connected to dielectric structure 127 and surface 121 can be exposed to the outside of dielectric structure 127.

Cavity 123 can be formed between surface 119 and surface 121 of lead 118. In some examples, coating 126 can also be formed between surface 119 and surface 121 of lead 118, following the contour of cavity 123 to thus further define cavity 123. In some examples, cavity 123 can comprise lead surface 124 connected to surface 121 and that can be parallel with surface 120, and lead surface 125 connected to lead surface 124 and surface 119 and that can be parallel with surfaces 121 or 121A. Here, lead surface 124 and lead surface 125 can be perpendicular to each other. However, since lead surface 124 and lead surface 125 can be actually subjected to or formed by etching in some examples, lead surface 124 and lead surface 125 can comprise curvature and can be curvedly connected to each other due to the characteristics of such processing.

In addition, coating 126 can be formed on surface 119 of lead 118 and on lead surface 124 and lead surface 125 of cavity 123. Additionally, coating 126 can be formed to conform to contours of surface 119 of lead 118 and on lead surface 124 and lead surface 125 of cavity 123. In some examples, lead flank 122 can have portions conforming to a surface contour of cavity 123 formed in lead 118. Here, lead surfaces 124 and 125 can be defined as components of lead 118.

Generally, surface 121 of lead 118 can be exposed to the outside through an exterior surface of dielectric structure 127, an exterior surface of encapsulant 140 or an exterior surface of coating 126. In some examples, surface 121 of lead 118 can be coplanar with the exterior surface of dielectric structure 127, with the exterior surface of encapsulant 140, or with the exterior surface of coating 126, where such feature can be the result of a sawing operation or a singulation operation of the manufacturing process.

A bottom surface of coating 115 formed on paddle 111, a bottom surface of dielectric structure 127, or a bottom surface of coating 126 formed on surface 119 of lead 118 can be coplanar with one another. However, since coating 126 can be formed to have a shape conforming to the surface contour of cavity 123 (i.e., lead surface 124 and lead surface 125), it can have a recessed shape in accordance with cavity 123.

Additionally, in some examples, conductive structure 116 can be made of, but not limited to, copper, copper/iron alloy, stainless steel, or copper/stainless steel/copper clad metal. For example, coating 126 can also be made of, but not limited to, gold, silver, nickel, palladium, tin or alloys.

In some examples, dielectric structure 127 can be referred to as a pre-molded part. Dielectric structure 127 can be interposed between paddle 111, pads 117, and leads 118, thus forming substrate 110 as a structure that includes dielectric structure 127 along with conductive structure 116. In some examples, dielectric structure 127 can serve to mechanically (e.g., non-electrically) connect paddle 111 to pads 117 and leads 118. Moreover, dielectric structure 127 can be mechanically connected to encapsulant 140, to coating 115 of paddle 111 or to coating 126 of lead 118 as well. In some examples, dielectric structure 127 can further comprise protrusion 128 upwardly protruding a predetermined height around pad 117 of conductive structure 116 to then be coupled to encapsulant 140.

In some examples, protrusion 128 of dielectric structure 127 can be shaped to upwardly protrude a predetermined height while generally bounding or surrounding one or more lateral surfaces of pad 117. In some examples, protrusion 128 can guide or restrain internal interconnection structure 131 so that it can be accurately aligned with pad 117 and to be temporarily positioned before internal interconnection structure 131 is permanently fixed to pad 117. Moreover, protrusion 128 of dielectric structure 127 can be coupled to encapsulant 140, thereby tightly coupling substrate 110 and encapsulant 140. In some examples, dielectric structure 127 comprises protrusion 128 and conductive structure 116 comprises pad 117 bounded by protrusion 128.

In some examples, dielectric structure 127 can comprise, but is not limited to, a molded material such as a thermally curable epoxy molding compound, an epoxy molding resin, or the like. In some examples, dielectric structure 127 can comprise only a single layer of the molded material. In some examples, dielectric structure 127 can comprise, but is not limited to, an inorganic filler (e.g., silica), an epoxy resin, a curing agent, a flame retardant, a curing promoting agent, a releasing agent, or the like.

Electronic device 130 can be mounted on substrate 110. In some examples, electronic device 130 can be electrically connected to paddle 111, to pads 117, or to leads 118 of conductive structure 116. In some examples, electronic device 130 can be electrically connected to pad 117 of conductive structure 116. Examples of electronic device 130 can comprise, but is not limited to, a logic die, a micro control unit, a memory, a digital signal processor, a network processor, a power management unit, an audio processor, a radio-frequency (RF) circuit, a wireless baseband system on chip processor, an application specific integrated circuit, a passive device, or equivalents. In some examples, electronic device 130 can comprise a semiconductor die or a semiconductor package.

Additionally, electronic device 130 can be electrically connected to paddle 111 or pad 117 of conductive structure 116 through internal interconnection structure 131. For example, internal interconnection structure 131 can comprise, but is not limited to, a variety of types for electrically bonding electronic device 130 to substrate 110, such as a micro bump, a metal pillar, a solder bump, a solder ball, or equivalents. As an example, internal interconnection structure 131 can comprise a copper pillar having a solder bump or solder cap 132 to be reflowed to or thermally compressed on substrate 110 to then be bonded. In some examples, internal interconnection structure 131 can have a pitch of approximately 20 to 50 μm or a pitch of approximately 90 to 100 μm, but not limited to that. There can also be examples where internal interconnection structure 131 can be a wirebond between top surface of electronic device 130 and pad 117.

Although not illustrated, non-conductive paste or capillary underfill can further be interposed between substrate 110 and electronic device 130. In some examples, non-conductive paste or capillary underfill can mechanically connect substrate 110 and electronic device 130 to each other and can surround internal interconnection structure 131. Therefore, non-conductive paste or capillary underfill can prevent substrate 110 and electronic device 130 from being peeled off due to a difference in thermal expansion coefficient between substrate 110 and electronic device 130.

In some examples, encapsulant 140 can be referred to as a post molded part. Encapsulant 140 can cover substrate 110 and electronic device 130, thereby protecting electronic device 130 from external environments. Examples of encapsulant 140 can comprise, but is not limited to, a molded material such as a thermally curable epoxy molding compound, an epoxy molding resin, or the like. In some examples, encapsulant 140 can comprise only a single layer of the molded material. In some examples, encapsulant 140 can comprise, but is not limited to, an inorganic filler (e.g., silica), an epoxy resin, a curing agent, a flame retardant, a curing promoting agent, a releasing agent, or the like. If the inorganic filler has a smaller size than a gap between substrate 110 and electronic device 130, encapsulant 140 can be interposed into the gap between substrate 110 and electronic device 130, thereby directly surrounding internal interconnection structure 131. Although encapsulant 140 shown in FIG. 1A completely surrounds electronic device 130, a top surface of electronic device 130 can be exposed or protruded to the outside through a top surface of encapsulant 140. Additionally, as described above, the exterior surface of encapsulant 140, surfaces 121 of conductive structure 116 or lead 118, the exterior surface of the coating 126 and the exterior surface of the dielectric structure 127 can be all coplanar with one another. Dielectric structure 127 and encapsulant 140 in substrate 110 can be formed using the same material or different materials.

In one example, dielectric structure 127 can have a smaller or much smaller modulus of elasticity than encapsulant 140. In some examples, dielectric structure 127 can have a larger or much larger modulus elasticity than encapsulant 140. Therefore, dielectric structure 127 can mitigate or avoid breakage due to external mechanical shocks or pressures but can change in its outward shape, thereby eventually preventing dielectric structure 127 from being broken in the course of manufacturing semiconductor device 100. When semiconductor device 100 can be exposed to a variety of environments while undergoing various processing operations, substrate 110 can be prevented from being damaged.

Substrate 110, electronic device 130, and encapsulant 140 can be referred to as a semiconductor package and can provide protection for electronic device 130 from external elements or environmental exposure. In addition, the semiconductor package can provide electrical coupling with external electrical components (not shown) through paddle 111 or leads 118. As shown in FIG. 1A to FIG. 1C, semiconductor device 100 of the present disclosure can comprise lead flank (or wettable flank) 122, including cavity 123 formed in lead 118 of conductive structure 116.

In some examples, cavity 123 of lead flank 122 can comprise or be defined by jamb surfaces 129 of dielectric structure 127, combined with perpendicular lead surfaces 124 and 125 of lead 118, or combined with perpendicular coating surfaces 126A and 126B of coating 126. Jamb surfaces 129 of dielectric structure 127 can be formed on opposite sides of lead flank 122, protruding at opposite sides of lead surface 124 and lead surface 125 of lead 118 to bound cavity 123. In some examples, lead surface 124 or lead surface 125 of lead 118 can be perpendicular to jamb surfaces 129 of the dielectric structure 127. A first surface 129 can be perpendicular to lead surfaces 124 and 125, or to coating surfaces 126A and 126B. A second jamb surface 129 can be perpendicular to lead surfaces 124 and 125, or to coating surfaces 126A and 126B, and can be opposite to the first jamb surface 129 across cavity 123.

In some examples, the position or shape of the solder connected to lead flank 122 during soldering can be defined by jamb surfaces 129 of dielectric structure 127. For instance, jamb surfaces 129 can restrict the solder from flowing towards adjacent lead flanks 122, thereby preventing shorts from occurring between neighboring leads 118. As described, an electrical connection area between lead 118 and the solder can be increased or strengthened by forming lead flank or wettable flank 122 of lead 118, thereby increasing secondary board level reliability and facilitating bond visual inspection test.

Figure 2A:
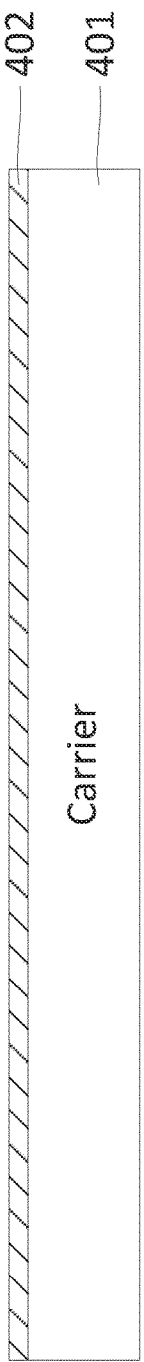
FIGS. 2A to 2L show cross-sectional views of an example method for manufacturing a semiconductor device.

FIGS. 2A to 2L show cross-sectional views of an example method for manufacturing a semiconductor device. FIG. 2A shows an example operation of forming a conductive layer on a carrier. As shown in FIG. 2A, in the forming of conductive layer on carrier, a conductive layer 402 having a predetermined thickness can be formed on a flat carrier 401 by sputtering, physical vapor deposition (PVD), chemical vapor deposition (CVD), atomic layer deposition (ALD), plasma vapor deposition, electroless plating, or electroplating. In some examples, conductive layer 402 can comprise one or more layers, such as a seed layer. There can be examples where conductive layer 402 can comprise a metallic foil or sheet that is attached to carrier 401. In some examples, conductive layer 402 can be, but is not limited to, titanium, tungsten, titanium/tungsten, copper, copper/iron alloy, or stainless steel. Examples of carrier 401 can be made of, but are not limited to, any suitable material such as silicon wafer, a low-grade silicon wafer, glass, ceramic, or a metal. The thickness of carrier 401 can range from about 500 μm to about 1500 μm and the width of carrier 401 can range from about 100 mm to 500 mm. Conductive layer 402 can range from 500 Å to 3000 Å in some examples.

Figure 2B:
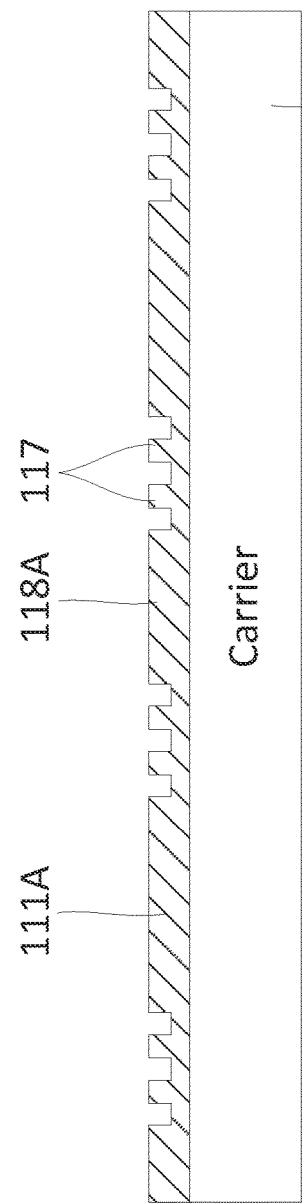

FIG. 2B shows an example operation of forming pads. As shown in FIG. 2B, pad 117 having a predetermined thickness, length, width and shape can be formed on conductive layer 402 for example on a top surface of conductive layer 402. Here, paddle base area 111A and lead base area 118A can be formed on conductive layer 402 as well as on pad 117. Additionally, pad 117 and land base area 118A can be electrically connected to each other. In some examples, pads 117, lead base area 118A, or paddle base area 111A can be plated on conductive layer 402, or can be etched into conductive layer 402.

In some examples, the formation of pad 117 can be carried out by performing process operations including, but not limited to, coating a photo resist on conductive layer 402, exposing the resulting structure to light with a mask placed on the photoresist, removing unnecessary photoresist by developing, plating pad 117 on conductive layer 402, or removing the photoresist remaining around pad 117. In some examples, forming pad 117 can comprise pattern plating on conductive layer 402. Thickness of paddle base area 111A, lead base area 118A, or pad 117 can range from about 1 μm to about 100 μm.

As the result of the operation shown in FIG. 2B, pad 117 along with a base for paddle 111 and leads 118 can be formed. In such a manner, pad 117 of conductive structures 116 can be completed.

Figure 2C:
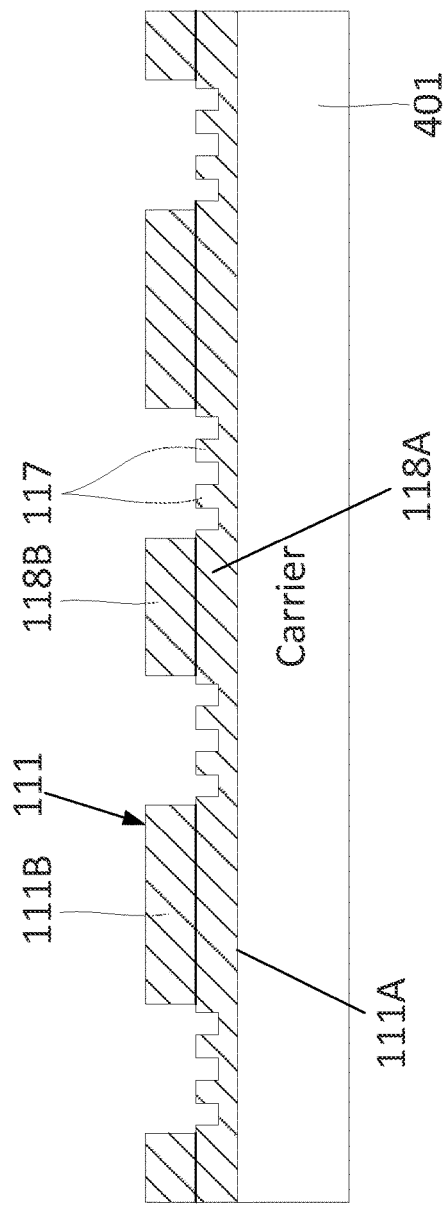

FIG. 2C shows an example operation of forming portions of conductive structure 116. As shown in FIG. 2C, further processing can be additionally carried out on the aforementioned base structures, thereby completing paddle 111 and lead 118. As an example, a photoresist mask can be applied over pads 117, followed by plating lead body 118B or paddle body 111B to a desired thickness over respective paddle base 111A or lead base 118A. Paddle 111 and lead 118 can be relatively thicker than pad 117. Thickness of paddle 111 and lead 118 can range from about 10 μm to about 1000 μm. In some examples paddle 111 and lead 118 can be formed by a plating process, a pillar plating process, or by an etching process.

Figure 2D:
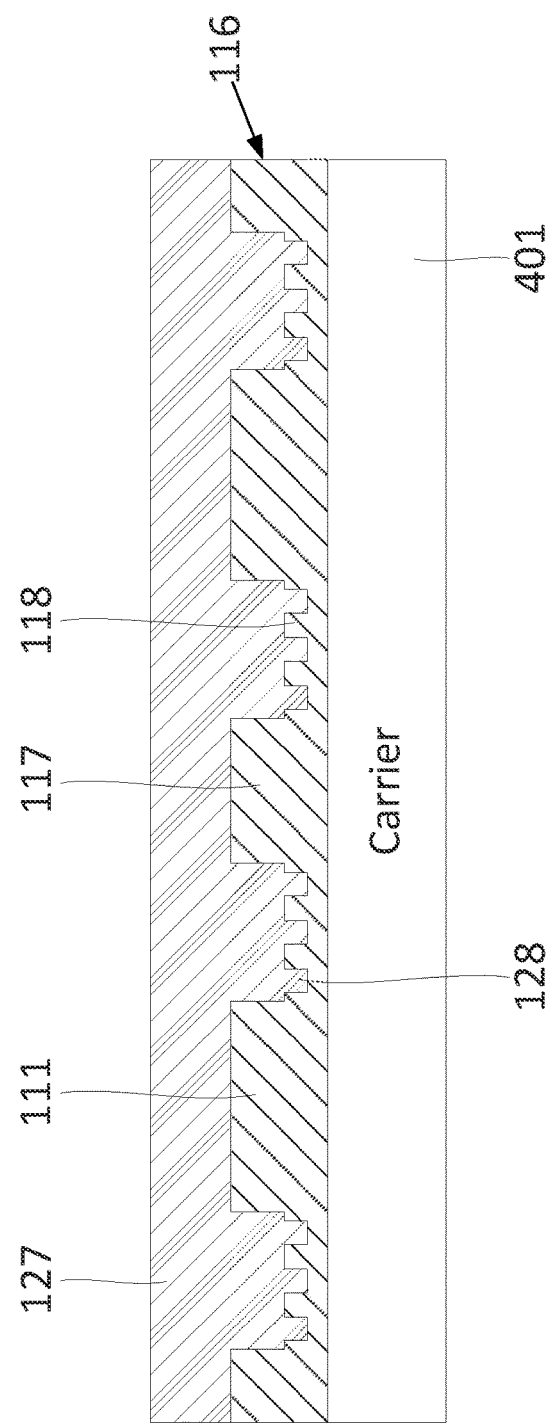

FIG. 2D shows an example operation of pre-molding. As shown in FIG. 2D, in the pre-molding, dielectric structure 127 can be formed on paddle 111, pad 117 and lead 118. For example, dielectric structure 127 can be formed using, but not limited to, an epoxy molding compound or an epoxy molding resin. In dielectric structure 127, the epoxy molding compound or the epoxy molding resin fills gaps between a plurality of protruding pads 117, thereby naturally forming a protrusion 128 between pads 117. For example, dielectric structure 127 can be formed by, but not limited to, general dispensing molding, compression molding, transfer molding, or the like. Thickness of dielectric structure 127 can range from about 10 μm to about 1000 μm. In some examples, dielectric structure 127 can be formed on the top surface of the conductive layer 402 wherein dielectric structure 127 covers pad 117 and lead 118.

Figure 2E:
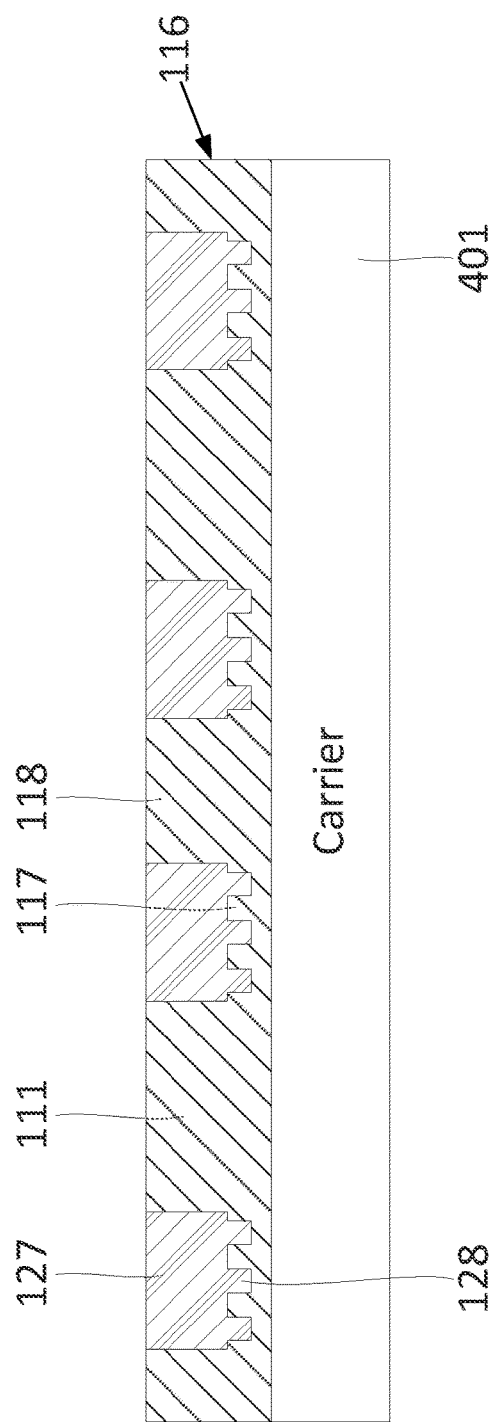

FIG. 2E shows an example operation of thinning the pre-molding. As shown in FIG. 2E, dielectric structure 127 can be thinned until paddle 111 and lead 118 are exposed. As a result, paddle 111, lead 118 or a resulting surface of dielectric structure 127 can become coplanar with one another. In some examples, the thinning process described above can be achieved by grinding.

Figure 2F:
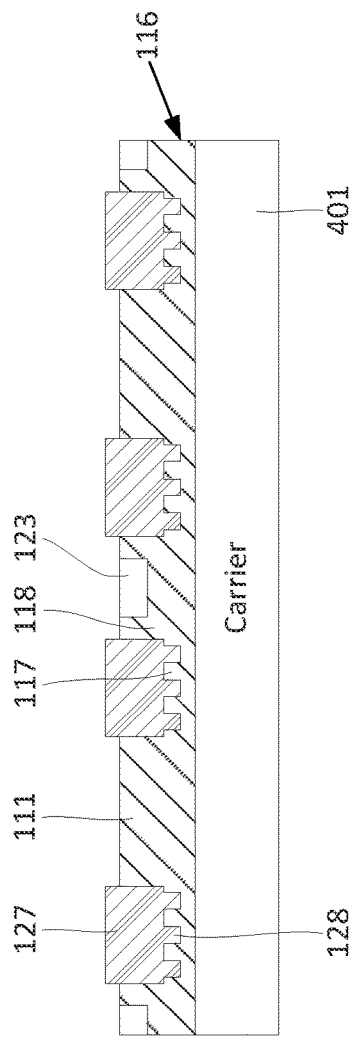

FIG. 2F shows an example operation of etching. As shown in FIG. 2F, paddle 111 and a portion corresponding to lead 118 can be etched, so that a surface of paddle 111 and a surface of lead 118 can become depressed relative to the surface of dielectric structure 127. In some examples, the etching operation can comprise a deep etching process. Etching depth of paddle 111 and portion corresponding to lead 118 can range from about 1 μm to about 10 μm.

Additionally, cavity 123 can be formed on a portion of lead 118. In some examples, cavity 123 can be formed by mechanical grinding using a diamond blade, by laser ablation, or by etching. Cavity depth of portion corresponding to cavity 123 can range from about 10 μm to about 100 μm. In some examples, cavity 123 can be formed in lead 118 adjacent to dielectric structure 127.

Figure 2G:
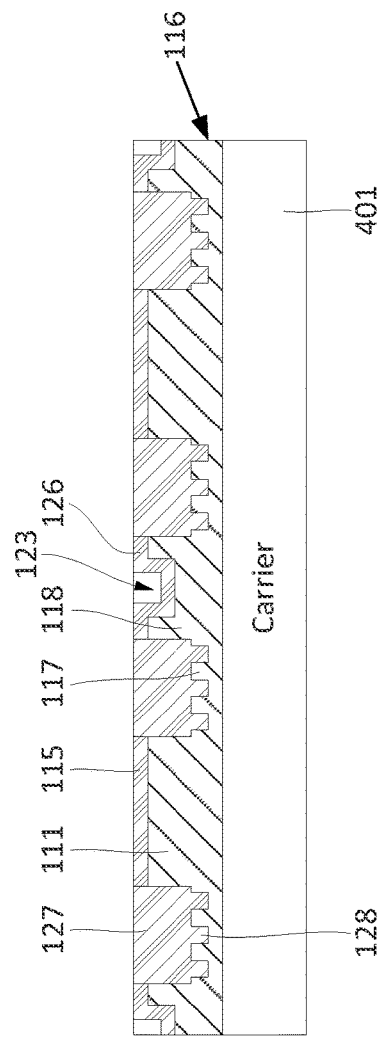
Figure 4:
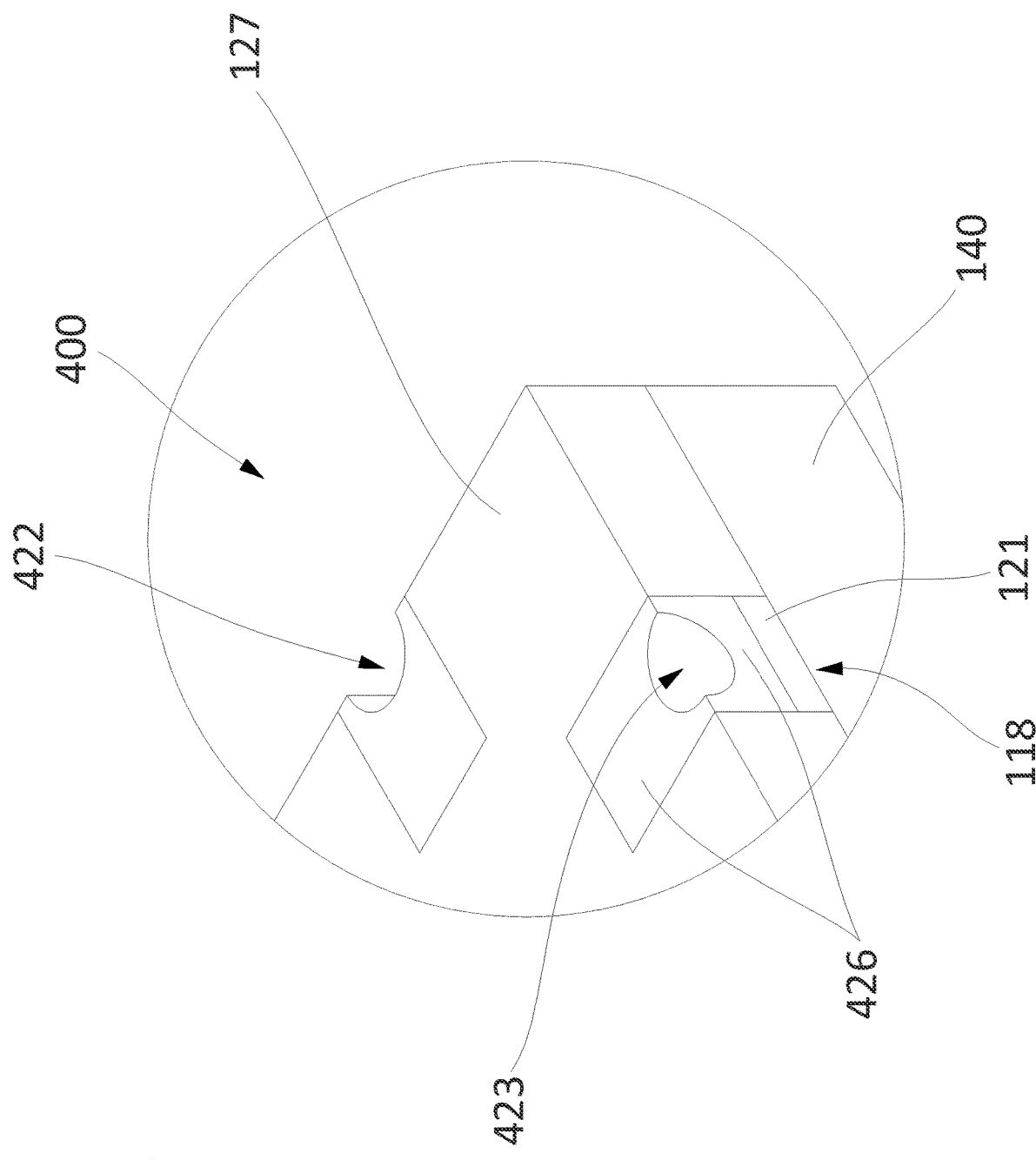
FIG. 4 shows partially enlarged views of an example for wettable flanks of semiconductor device.

FIG. 2G shows an example operation of forming of external conductive layers. As shown in FIG. 2G, coatings 115 and 126 having a predetermined thickness can be formed on respective surfaces of paddle 111, and on lead 118 including the surface of cavity 123. Here, surfaces of coatings 115 and 126 can be coplanar with the surface of dielectric structure 127. Since coating 126 of cavity 123 can be conformally formed along the surface contour of cavity 123, it can have a recessed shape defined by cavity 123. In some examples, coatings 115 and 126 can protrude past the surface of dielectric structure 127. In some examples, coating 115 and coating 126 can be formed on lead 118 including on a surface of lead 118 in the cavity 123 to form a wettable flank 422 as shown in FIG. 4 below corresponding to the plated lead 118 in the cavity.

In some examples, coatings 115 and 126 can be formed by, but not limited to, sputtering, physical vapor deposition (PVD), chemical vapor deposition (CVD), atomic layer deposition (ALD), plasma vapor deposition, electroless plating, or electroplating. In addition, coatings 115 and 126 can be formed using the same process or can be formed as multiple layers using different processes in combination. For example, coatings 115 and 126 can be made of, but are not limited to, gold, silver, nickel, palladium, tin, or alloys. The thickness of coatings 115 and 126 can range from about 1 µM to about 10 µm.

Figure 2H:
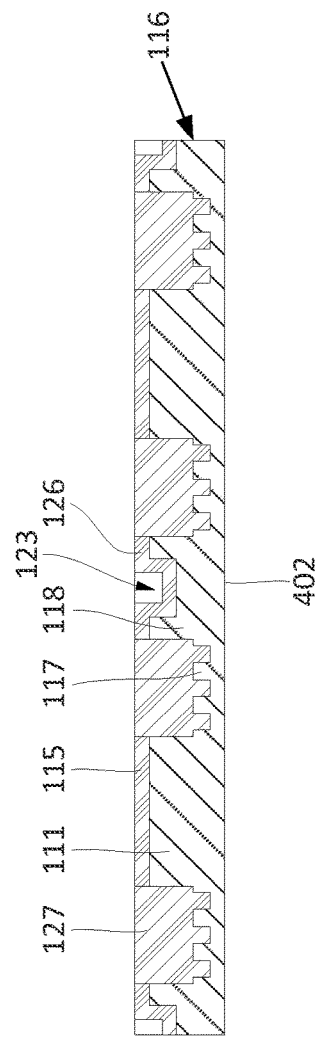

FIG. 2H shows an example operation of removing of carrier. As shown in FIG. 2H, carrier 401 can be removed from conductive layer 402. In some examples, carrier 401 can be removed by, but not limited to, etching, grinding, or physically peeling. Paddle 111 and pad 117 and lead 118 can be formed on conductive layer 402 to have different thicknesses, and when carrier 401 is removed, a bottom surface of conductive layer 402 can remain planar.

Figure 2I:
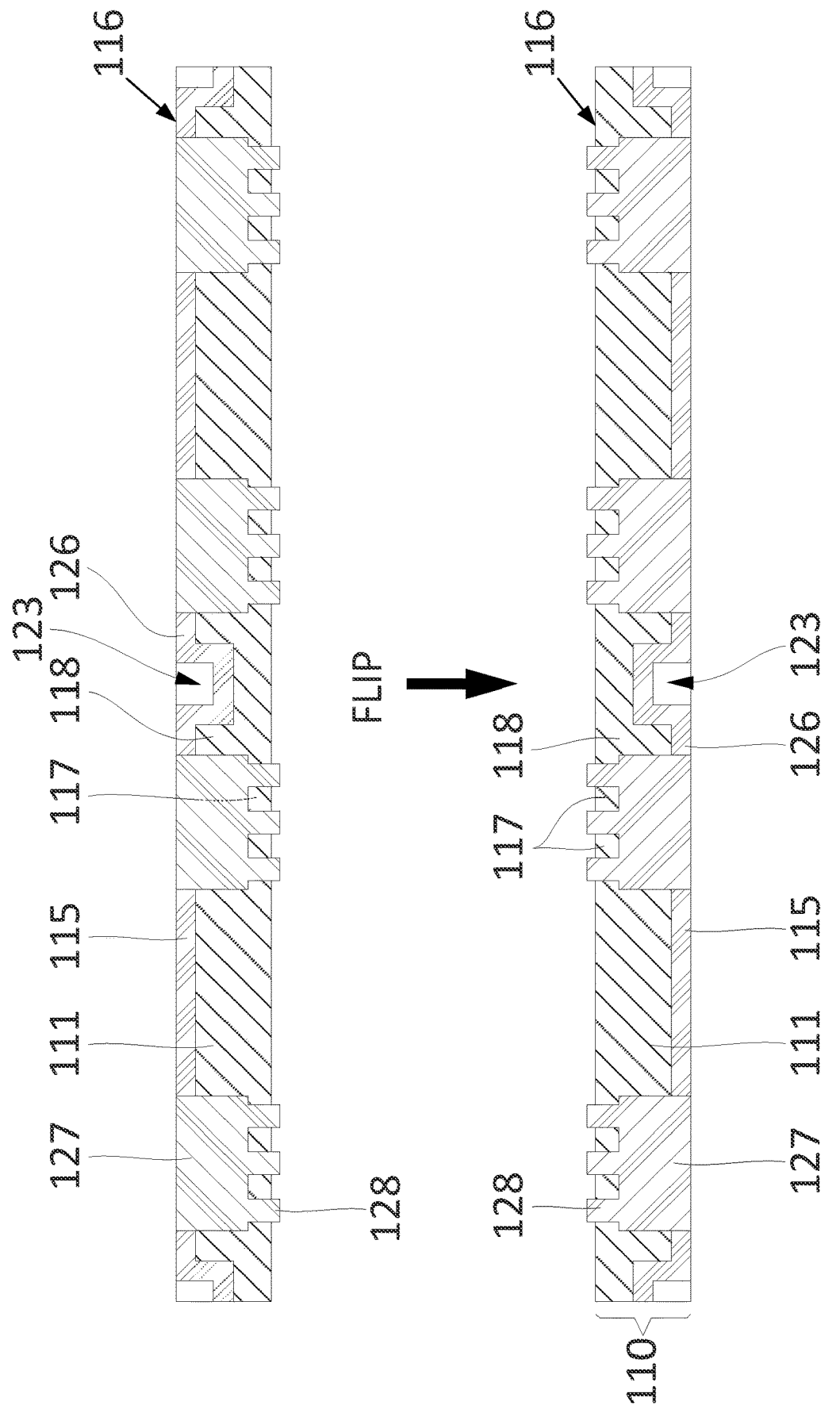

FIG. 2I shows an example operation of soft etching. As shown in FIG. 2I, conductive layer 402 is downwardly exposed by removing carrier 401, a bottom surface of paddle 111 and bottom surfaces of pad 117 and lead 118 can be etched (soft etched), so that the bottom surface of paddle 111 and bottom surfaces of pad 117 and lead 118 can become slightly depressed relative to the bottom surface of dielectric structure 127.

As a result of the above, protrusion 128 surrounding pad 117 can be formed on dielectric structure 127 so that protrusion 128 of dielectric structure 127 protrudes beyond the bottom surface of pad 117. In some examples, protrusion 128 protrudes while surrounding opposite surfaces of pad 117. The thickness of protrusion 128 can range from about 1 µm about 10 µm.

Figure 5:
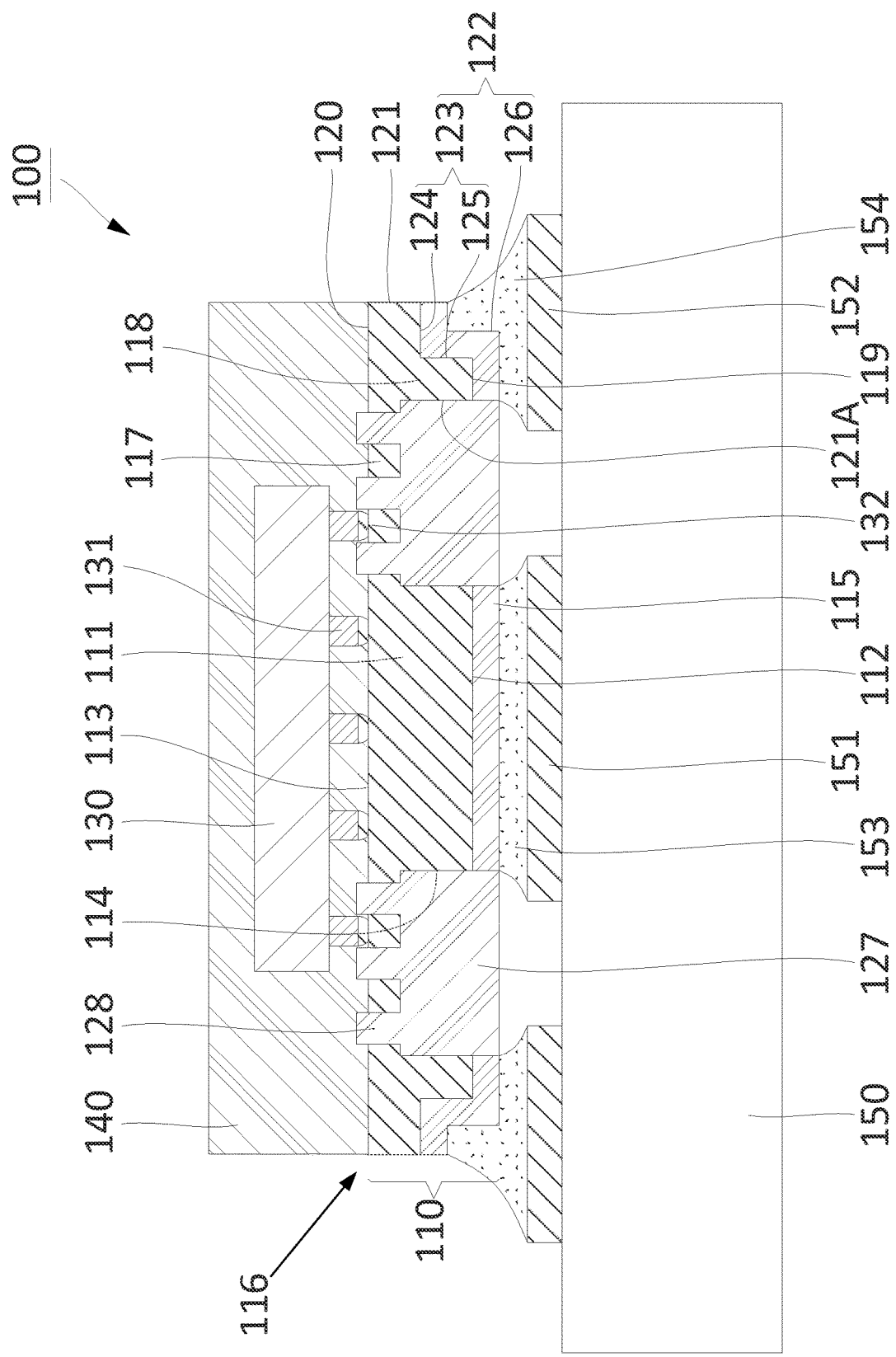
FIG. 5 shows a cross-sectional view of an example state in which a semiconductor device can be soldered to an external device.

As the result of soft etching, substrate 110 can be completed. In some examples, as shown in FIG. 2I, substrate 110 can be flipped, thereby completing substrate 110 including conductive structure 116 having paddle 111 with pads 117 and leads 118 arranged around paddle 111, and having dielectric structure 127 connecting the elements of conductive structure 116 to each other. Conductive structure 116 can comprise pad 117 electrically connected to electronic device 130, and lead 118 electrically connected to an external device 150 as shown in FIG. 5. Pad 117 and lead 118 can be connected to each other via a trace or path part of conductive structure 116.

In some examples, lead 118 can comprise cavity 123, and coating 126 can be formed along surfaces of lead 118 and its cavity 123. In such a manner, lead flank 122 can be defined, including cavity 123 and coating 126. Coating 115 is formed on a surface of paddle 111 as well.

Figure 2J:
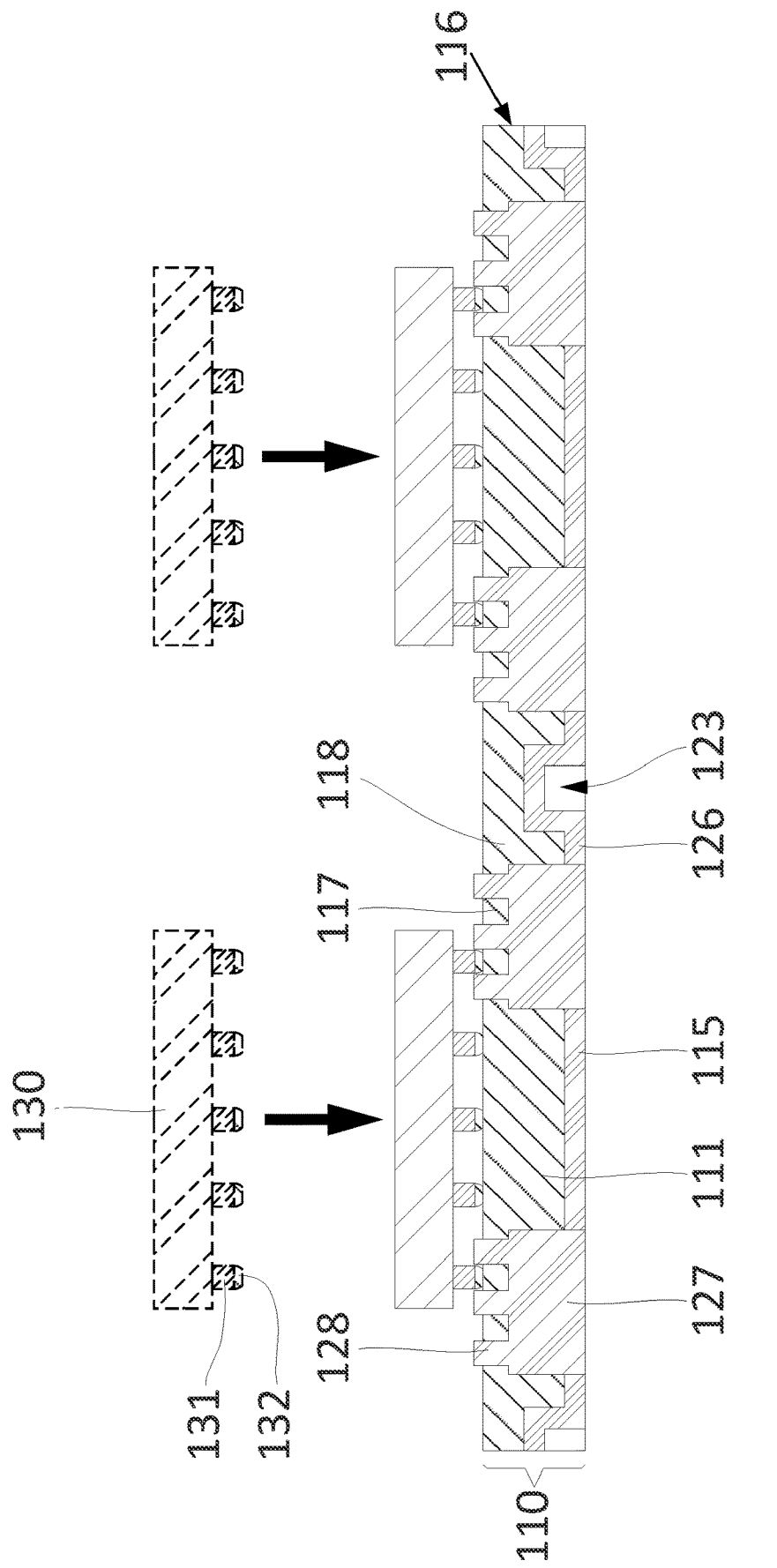

FIG. 2J shows an example operation of attaching electronic devices such as a semiconductor die. As shown in FIG. 2J, electronic device 130 can be electrically connected to paddle 111 and pad 117 of substrate 110 through internal interconnection structure 131. In some examples, electronic device 130 can be electrically connected to paddle 111 and pad 117 in substrate 110 through, but not limited to, thermal compression or mass reflow. There can also be examples where internal interconnection structure 131 can be a wire-bond between the top surface of electronic device 130 and pad 117. The thickness of electronic device 130 can range from about 50 µm to about 1000 µm.

Before the attaching of electronic device 130 such as a semiconductor die, non-conductive paste can be optionally interposed between electronic device 130 and paddle 111 of substrate 110. Alternatively, after the attaching of electronic device 130, capillary underfill can be optionally injected into a gap between electronic device 130 and paddle 111 of substrate 110.

Figure 2K:
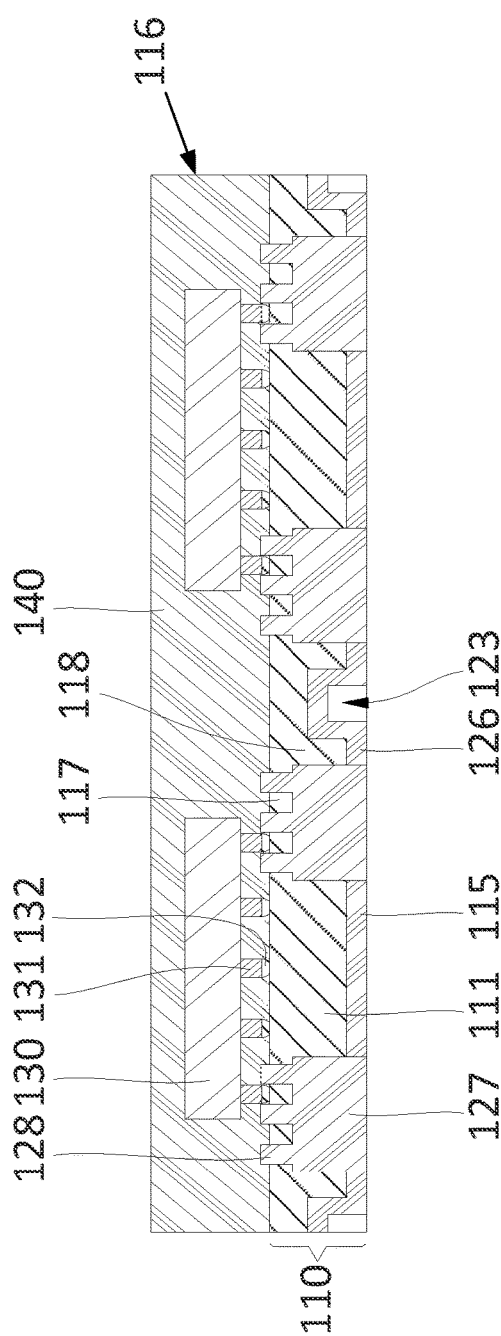

FIG. 2K shows an example operation of encapsulation or post molding. As shown in FIG. 2K, substrate 110 and electronic device 130 attached onto substrate 110 can be surrounded by encapsulant 140. For example, encapsulant 140 can be formed using, but not limited to, an epoxy molding compound or an epoxy molding resin. In some examples, encapsulant 140 can be formed by, but not limited to, general dispensing molding, compression molding, transfer molding, or the like. As the result of the post molding, encapsulant 140 can be non-electrically connected to paddle 111 of substrate 110, pad 117 and lead 118 in conductive structure 116, and dielectric structure 127 while surrounding electronic device 130 and internal interconnection structure 131. The thickness of encapsulant 140 can range from about 50 µm to about 1000 µm.

Figure 2L:
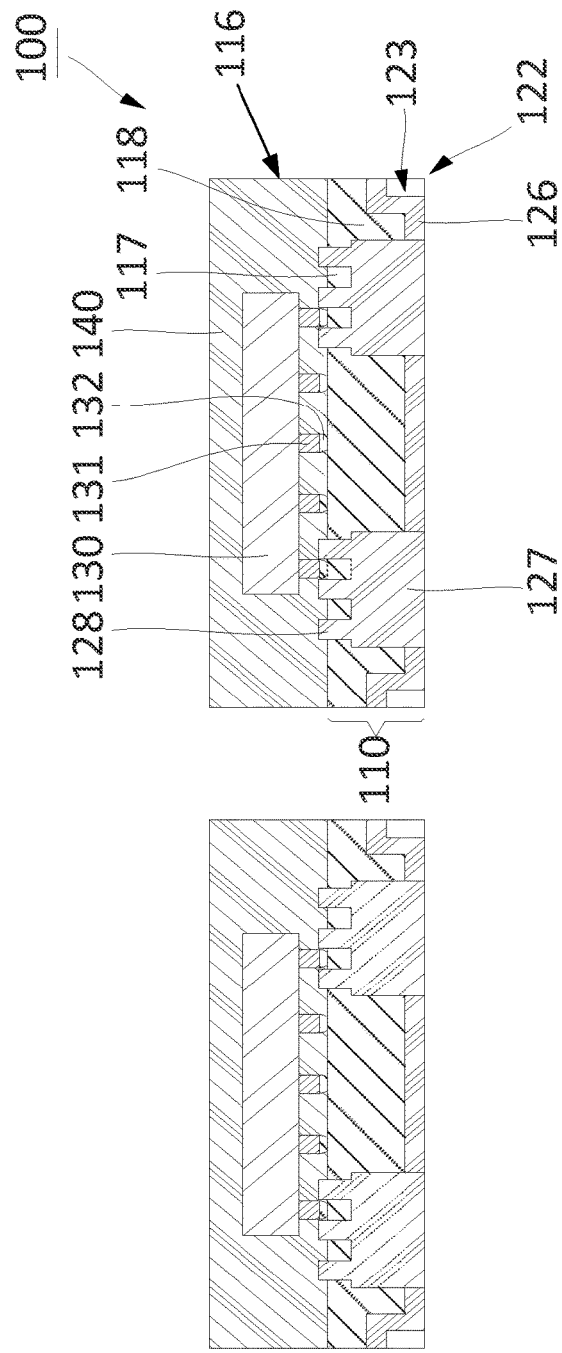

FIG. 2L shows an example operation of singulation. As shown in FIG. 2L, substrate 110 and encapsulant 140 can be singulated using for example a sawing tool, thereby providing individual semiconductor devices 100. In some examples, in order to enhance productivity, semiconductor device 100 can be manufactured in a strip or matrix type and be singulated into individual semiconductor devices 100 as discrete semiconductor devices. Here, a region corresponding to cavity 123 having coating 126 can be subjected to sawing, and conductive layers having wettable lead flanks 122 can be formed along the edge of the semiconductor device 100.

As the result of singulation, lateral surfaces of substrate 110 and exterior surfaces of encapsulant 140 can become coplanar. In some examples, lateral surfaces of lead 118 in substrate 110, lateral surfaces of dielectric structure 127 or lateral surfaces of lead flank 122 (lateral surfaces of the coating 126) can become coplanar.

As described above, in the semiconductor device of the present disclosure and the manufacturing method the semiconductor device, wettable flanks (inspectable joints or solderable lead ends) can be further formed on leads 118, thereby increasing the solder joint regions of the leads 118. In some examples, in the semiconductor device of the present disclosure and the manufacturing method the semiconductor device, secondary board level reliability can be increased, and a vision test of the solder joint regions can be facilitated by further forming wettable flanks.

In addition, in the semiconductor device of the present disclosure and the manufacturing method the semiconductor device, a conductive layer can be formed on a carrier and conductive structure, and conductive structures (pads and lands) and dielectric structure can be formed on a conductive layer. A pre-molded substrate can be completed by forming wettable flanks including cavity and plating layer on conductive structures, thereby easily manufacturing the wettable flanks without using a bus bar.

Figure 3:
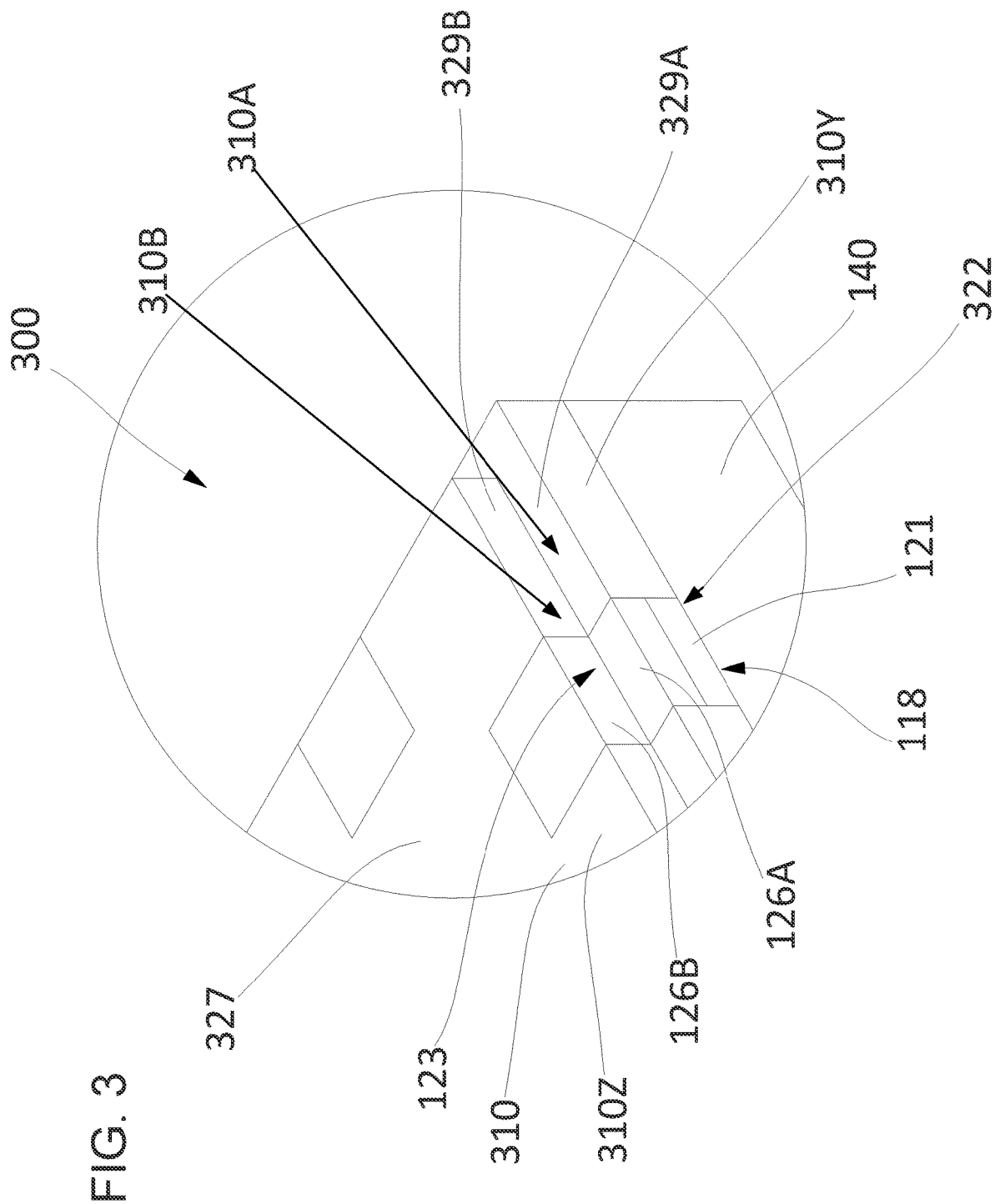
FIG. 3 shows partially enlarged views of an example for wettable flanks of semiconductor device.

FIG. 3 shows partially enlarged views of an example for wettable flanks of a semiconductor device 300. Semiconductor device 300 comprises substrate 310, similar to substrate 110, and having substrate lateral side 310Y and substrate bottom side 310Z. Substrate 310 also comprises substrate interior side 310A perpendicular to substrate lateral side 310Y, and substrate interior side 310B perpendicular to substrate bottom side 310Z. Substrate interior side 310A comprises interior surface 329A of dielectric structure 327, and coating surface 126A of coating 126. Substrate interior side 310B comprises interior surface 329B of dielectric structure 327, and coating surface 126B of coating 126. Substrate interior side 310A can be perpendicular to substrate interior side 310B. As shown in FIG. 3, a lead flank (or wettable flank) 322 with cavity 123 formed in lead 118 (i.e., between lead surface 124 and lead surface 125 shown in FIG. 1), can be coplanar with interior surfaces 329A and 329B of dielectric structure 327. Dielectric structure 327 can be otherwise similar to previously described dielectric structure 127. In some examples, interior surface 329A, which can be substantially perpendicular to the exterior lateral surface of dielectric structure 327, can be substantially coplanar with lead surface 124 (FIG. 1) of lead 118 or with coating surface 126a of coating 126 formed on lead 118. In the same or other examples, surface 329B, which can be substantially perpendicular to the exterior bottom surface of dielectric structure 327, can be substantially coplanar with lead surface 125 (FIG. 1) of lead 118 or with coating surface 126b of coating 126 formed on lead 118. In some examples, interior surface 329A and interior surface 329B of dielectric structure 327 can be substantially perpendicular to each other.

FIG. 4 shows partially enlarged views of an example for wettable flanks of semiconductor device 400. As shown in FIG. 4, in semiconductor device 400 of the present disclosure, lead flank (or wettable flank) 422 formed on lead 118 can be similar to lead flank 122 (FIG. 1) but comprises a dimple. In particular, lead flank 422 comprises cavity 423 that can be similar to cavity 123 (FIG. 1), but is instead dimple-shaped by, for example, a dimple-defining etching into lead 118 otherwise similar to that described above with respect to cavity 123 in FIGS. 2F-2G. Lead flank 422, including cavity 423, can be covered by plating layer 426 that can be similar to coating 126 (FIGS. 1, 2G). In some examples, plating layer 246 can be formed on lead 118 including on a surface of lead 118 in the cavity to form a wettable flank 422 corresponding to the plated lead 118 in the cavity.

FIG. 5 shows a cross-sectional view of an example state in which a semiconductor device can be mounted to an external device. As illustrated in FIG. 5, semiconductor device 100 can be mounted on circuit patterns 151 and 152 of external device 150 using, for example, solders 153 and 154. In some examples, in semiconductor device 100, paddle 111 and lead 118, or lead flanks 122 of substrate 110 can be electrically connected to circuit patterns 151 and 152 of external device 150 using solders 153 and 154, respectively.

Here, cavity 123 and coating 126 can be further formed on lead 118 to increase solder joint regions between lead 118 and solder 154, thereby improving secondary board level reliability of semiconductor device 100. In addition, since solder joints can be well observed even from the outside of semiconductor device 100 due to the increased joint height or volume afforded by cavity 123, an equipment-based vision test can be more accurately and rapidly performed.

The present disclosure comprises reference to certain examples, however, it will be understood by those skilled in the art that various changes may be made, and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A method to manufacture a semiconductor device, comprising:

forming a pad and a lead on a top side of a conductive layer;

forming a dielectric structure on the top side of the conductive layer, wherein the dielectric structure covers the pad and the lead;

thinning the dielectric structure until the lead is exposed;

etching the lead so that a surface of the lead is depressed relative to a surface of the dielectric structure;

forming a cavity in the lead adjacent to the dielectric structure;

forming a plating layer on the lead, including on a portion of the lead in the cavity, to define a wettable flank of the lead in the cavity; and etching a bottom side of the conductive layer so that a protrusion of the dielectric structure protrudes beyond a bottom of the pad.

2. The method of claim 1, further comprising:

placing an electronic device on the bottom side of the conductive layer to couple the electronic device to the pad; and forming an encapsulant over the electronic device, wherein the encapsulant contacts a lateral side of the electronic device and the protrusion of the dielectric structure extends into the encapsulant.

3. The method of claim 1, further comprising:

forming a paddle on the top side of the conductive layer when the lead is formed wherein forming the lead comprises plating a lead body on the conductive layer.

4. The method of claim 1, wherein said thinning the dielectric structure comprises grinding the dielectric structure.

5. The method of claim 1, wherein forming the pad and the lead comprises:

forming the pad and a lead base of the lead on the conductive layer; and plating a lead body on the lead base.

6. A method to manufacture a semiconductor device, comprising:

providing a conductive structure comprising a first side and a second side opposite to the first side;

providing a dielectric structure in adjacent to the first side of the conductive structure, wherein the dielectric structure comprises a protrusion and the conductive structure comprises a pad bounded by the protrusion and a lead adjacent to the dielectric structure;

etching the first side of the conductive structure such that a surface of the lead is depressed relative to a surface of the dielectric structure;

providing a cavity in the lead adjacent to the dielectric structure; and providing a plating on the conductive structure to cover the lead, including covering a portion of the lead in the cavity, wherein the plated cavity defines a wettable flank of the lead.

7. The method of claim 6, further comprising:

attaching an electronic device to the conductive structure, wherein the electronic device is electrically coupled with the pad via an internal interconnect; and forming a molding compound to cover the electronic device, wherein the molding compound contacts a side surface of the electronic device, and wherein the protrusion of the dielectric structure extends into the molding compound.

8. The method of claim 6, wherein providing the cavity comprises forming a first cavity surface perpendicular to a second cavity surface.

9. The method of claim 6, wherein said providing the cavity comprises forming a dimple-shaped cavity surface.

10. The method of claim 7, wherein:

the protrusion protrudes higher than a top surface of the pad; and a bottom portion of the internal interconnect is bounded by the protrusion.

11. A method to manufacture a semiconductor device, comprising:

providing a conductive layer comprising a first side and a second side opposite to the first side;

providing a pad on the first side of the conductive layer;

providing a paddle on the first side of the conductive layer, and a lead on the first side of the conductive layer adjacent to the pad;

providing a dielectric structure on the first side of the conductive layer over the paddle and over the lead, wherein the dielectric structure comprises a protrusion adjacent to the pad;

removing a portion of the dielectric structure to expose the paddle and the lead;

providing a cavity in an exposed side of the lead; and providing a plating layer in the cavity of the lead.

12. The method of claim 11, wherein:

a side of the dielectric structure is coplanar with an exposed side of the paddle and the exposed side of the lead after removing the portion of the dielectric structure.

13. The method of claim 11, comprising:

removing a portion of the lead at the exposed side of the lead;

wherein an exposed side of the dielectric structure protrudes above the exposed side of the lead.

14. The method of claim 11, wherein a surface of the plating layer protrudes past an exposed side of the dielectric structure.

15. The method of claim 11, wherein a surface of the plating layer is substantially coplanar with an exposed side of the dielectric structure.

16. The method of claim 11, wherein the conductive layer comprises a copper foil.

17. The method of claim 11, wherein the cavity is formed via etching the first side of the conductive layer.

18. The method of claim 11, wherein the paddle and the lead are formed via a plating process.

19. The method of claim 1, wherein:

the conductive layer is formed on a carrier; and removing the carrier prior to etching the bottom side of the conductive layer.

20. The method of claim 5, comprising:

forming a paddle base on the conductive layer when the lead base is formed; and plating a paddle body on the paddle base when the lead body is plated.

* * * * *